(12) United States Patent  
Wu et al.

(10) Patent No.: US 7,758,308 B2
(45) Date of Patent: Jul. 20, 2010

(54) MOUNTING APPARATUS FOR FAN

(75) Inventors: Chia-Kang Wu, Tu-Cheng (TW); Li-Ping Chen, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 935 days.

(21) Appl. No.: 11/309,888

(22) Filed: Oct. 17, 2006

(65) Prior Publication Data

US 2008/0090511 A1  Apr. 17, 2008

(51) Int. Cl.
 *H05K 7/20* (2006.01)
(52) U.S. Cl. .................................... 415/214.1
(58) Field of Classification Search ............ 415/214.1, 415/220; 361/379.48, 695
See application file for complete search history.

(56) References Cited

U.S. PATENT DOCUMENTS

| | | | |
|---|---|---|---|
| 6,236,564 B1 * | 5/2001 | Fan ........................... | 361/695 |
| 6,244,953 B1 * | 6/2001 | Dugan et al. ................ | 361/695 |
| 6,351,380 B1 * | 2/2002 | Curlee et al. ................ | 361/695 |
| 6,639,796 B2 * | 10/2003 | Cannon ....................... | 361/695 |
| 6,808,411 B2 | 10/2004 | Chen | |
| 6,871,879 B2 * | 3/2005 | Gan ........................... | 285/189 |
| 6,999,313 B2 | 2/2006 | Shih | |
| 7,352,574 B2 * | 4/2008 | Chen .......................... | 361/695 |
| 7,411,788 B2 * | 8/2008 | Liang ......................... | 361/695 |
| 7,522,415 B2 * | 4/2009 | Fan et al. ..................... | 361/695 |
| 2004/0247431 A1 | 12/2004 | Chen et al. | |
| 2005/0280990 A1 * | 12/2005 | Goodenough et al. ....... | 361/695 |
| 2009/0021911 A1 * | 1/2009 | Lee et al. ..................... | 361/695 |

\* cited by examiner

*Primary Examiner*—Edward Look
*Assistant Examiner*—Nathaniel Wiehe
(74) *Attorney, Agent, or Firm*—Wei Te Chung

(57) ABSTRACT

A mounting apparatus for a fan (10) with a plurality of through holes (12) defined includes a chassis (20) and a bracket (30). The chassis includes a bottom plate (22), and a side plate (24) perpendicular to the bottom plate. A pair of positioning pieces (222) and a protrusion (224) is formed on the bottom plate. The bracket is removably secured to the bottom plate for preventing the fan moving away from the side plate. A plurality of posts (38) protrudes from the bracket for inserting into the through holes of the fan. A pair of positioning tabs (344) extends from the bracket for engaging with the positioning pieces of the bottom plate and a handle with a block formed thereon is formed at the bracket. The block engages with the protrusion of the bottom plate for preventing the positioning tabs detaching from the positioning pieces, and is disengagable therefrom by driving the handle.

19 Claims, 4 Drawing Sheets

MOUNTING APPARATUS FOR FAN

FIELD OF THE INVENTION

The present invention relates to mounting apparatuses for fans, and more particularly to a mounting apparatus for a fan of a computer system.

DESCRIPTION OF RELATED ART

In a working computer system, a large amount of heat is generated from electric elements of the computer system. If the heat is not dissipated timely, the electric elements may be damaged. So, heat dissipating devices are desired.

A fan is often used as a conventional means to dissipate the heat in the computer system. In this conventional means, a bracket is provided for receiving the fan. A plurality of through holes is defined in the bracket. In installing the fan to a plate of the computer system, the fan is received into the bracket. The bracket together with the fan is placed on the plate which defines a plurality of screw holes therein. The through holes of the bracket align with the screw holes of the plate. The fan is enclosed by the bracket and the plate. A plurality of screws extends through the through holes and is screwed into the corresponding screw holes. The fan is thereby secured to the plate of the computer system. In this mounting means, it is well known that assembly and disassembly of the fans is very inconvenient.

What is needed, therefore, is a mounting apparatus for conveniently assembling and disassembling a fan in a computer system.

SUMMARY OF INVENTION

A mounting apparatus for a fan with a plurality of through holes defined includes a chassis and a bracket. The chassis includes a bottom plate, and a side plate perpendicular to the bottom plate for the fan abutting thereon. A pair of positioning pieces and a protrusion are formed on the bottom plate. The bracket is removably secured to the bottom plate for preventing the fan moving away from the side plate. A plurality of posts protrudes from the bracket for inserting into the through holes of the fan to prevent the fan moving on the side plate. A pair of positioning tabs extends from the bracket for engaging with the positioning pieces of the bottom plate and a resilient handle with a block formed thereon is formed at the bracket. The block engages with the protrusion of the bottom plate for preventing the positioning tabs detaching from the positioning pieces, and is disengagable therefrom by driving the handle.

Other advantages and novel features will be drawn from the following detailed description of preferred embodiments with attached drawings, in which:

DETAILED DESCRIPTION

Figure 1:
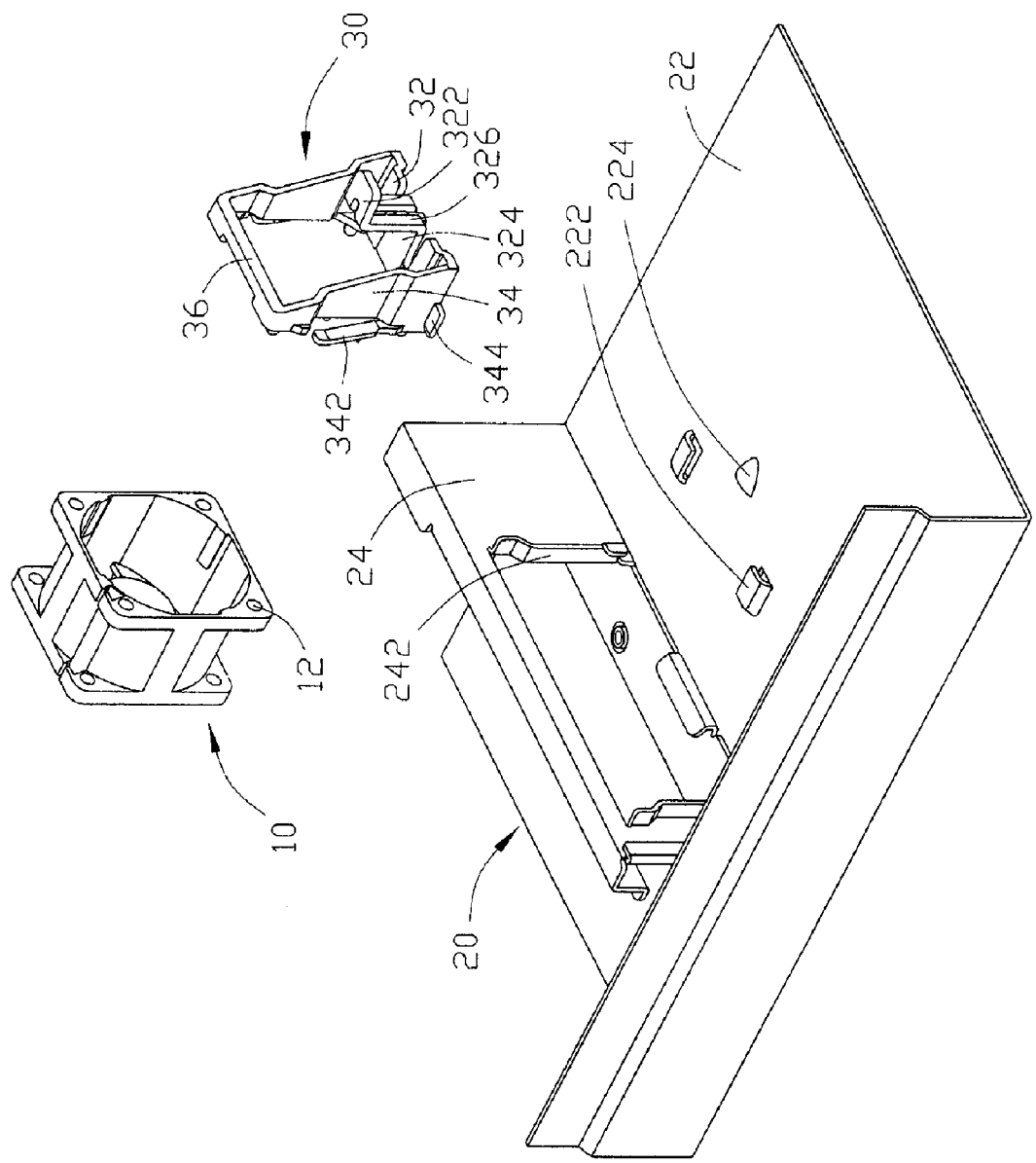
FIG. 1 is an exploded, isometric view of a mounting apparatus for a fan of a preferred embodiment of the present invention, the mounting apparatus including a computer chassis and a bracket.

Referring to FIG. 1, a mounting apparatus of a preferred embodiment of the present invention is configured for securing a fan 10 in a computer system. The fan 10 defines a through hole 12 in each corner thereof. The mounting apparatus includes a computer chassis 20 and a bracket 30.

The chassis 20 is capable of receiving electronic devices, such as a motherboard, disk drives, etc, and includes a bottom plate 22 and a side plate 24 perpendicular to the bottom plate 22. A pair of positioning pieces 222 protrudes up from the bottom plate 22 adjacent the side plate 24. A gap is thereby defined between each positioning piece 222 and the bottom plate 22. A protrusion 224 is formed up on the bottom plate 22 between the positioning pieces 222. A flange 242 is bent from the side plate 24, adjacent one of the positioning pieces 222.

Figure 2:
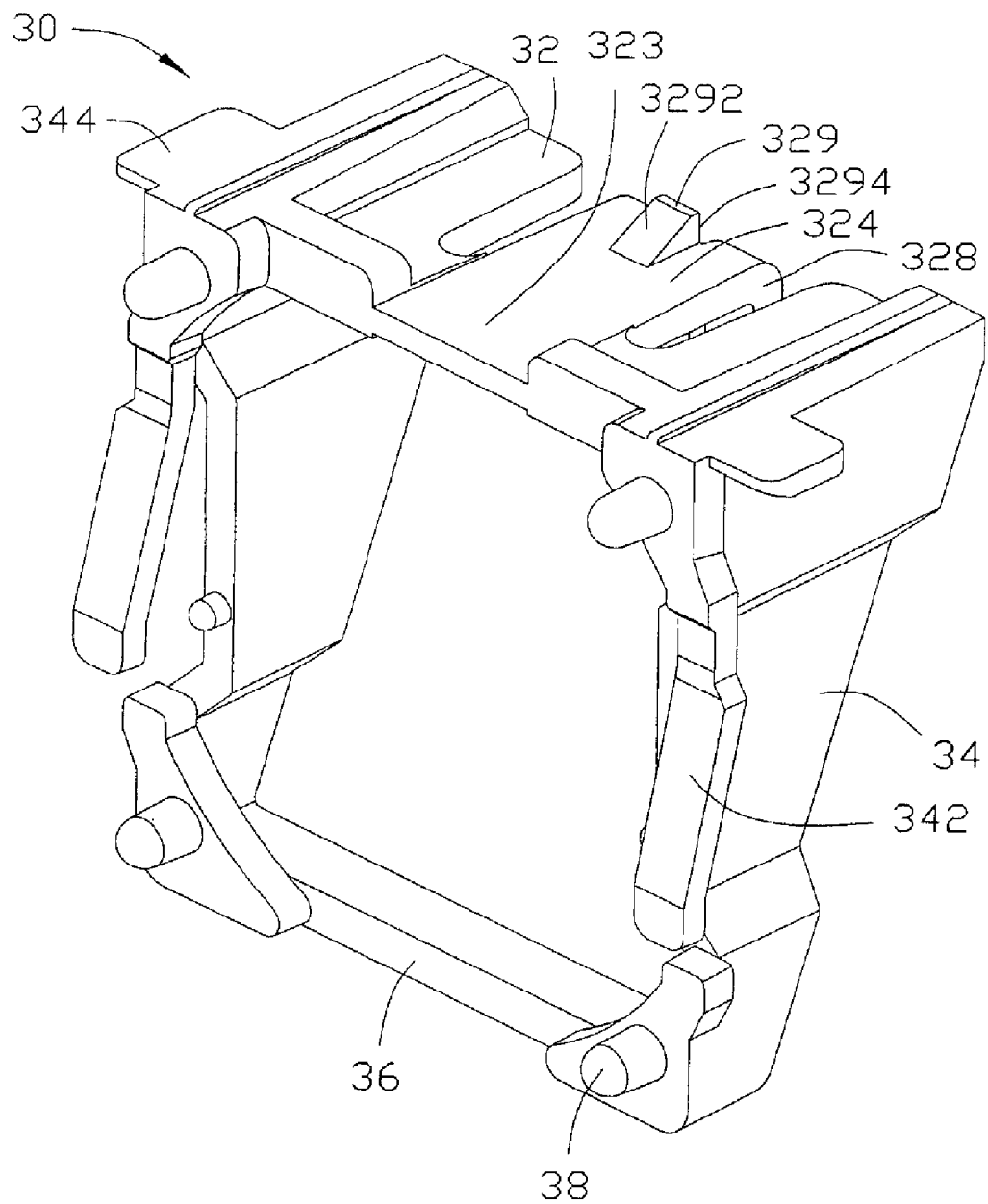
FIG. 2 is another isometric view of the bracket of FIG. 1.

Referring to FIGS. 1 and 2, the bracket 30 includes a bottom wall 32, a pair of side walls 34 perpendicularly bent up from the bottom wall 32, and a bar 36 connecting with top ends of the side walls 34. A post 38 perpendicular to the side plate 24 of the chassis 20 extends from each corner of the bracket 30, for inserting into the through holes 12 of the fan 10. A handle 322 is formed on a top portion of the bottom wall 32, and a recess 323 is defined in a bottom portion thereof for the protrusion 224 sliding therein when the bracket 30 slides on the bottom plate 22. The handle 322 includes a resilient base portion 324 and a generally L-shaped operating portion 326 bent up from a free end of the base portion 324. Two cutouts 328 are defined in the base wall 32 in both sides of the base portion 324, for easily deforming the base portion 324. A wedge-shaped block 329 protrudes down from a bottom surface of the base portion 324, corresponding to the protrusion 224 of the bottom plate 22 of the chassis 20. The block 329 has a slanted surface 3292 for allowing the block 329 to easily slide across the protrusion 224 of the bottom plate 22, and a stop surface 3294 for engaging with the protrusion 224 to block the bracket 30 from sliding reversely. Two resilient fingers 342 respectively extend upward and outward from bottom portions of side edges of the side walls 34, towards the side plate 24 of the chassis 20. Two positioning tabs 344 perpendicularly extend out from bottom edges of the side walls 34, respectively.

Figure 3:
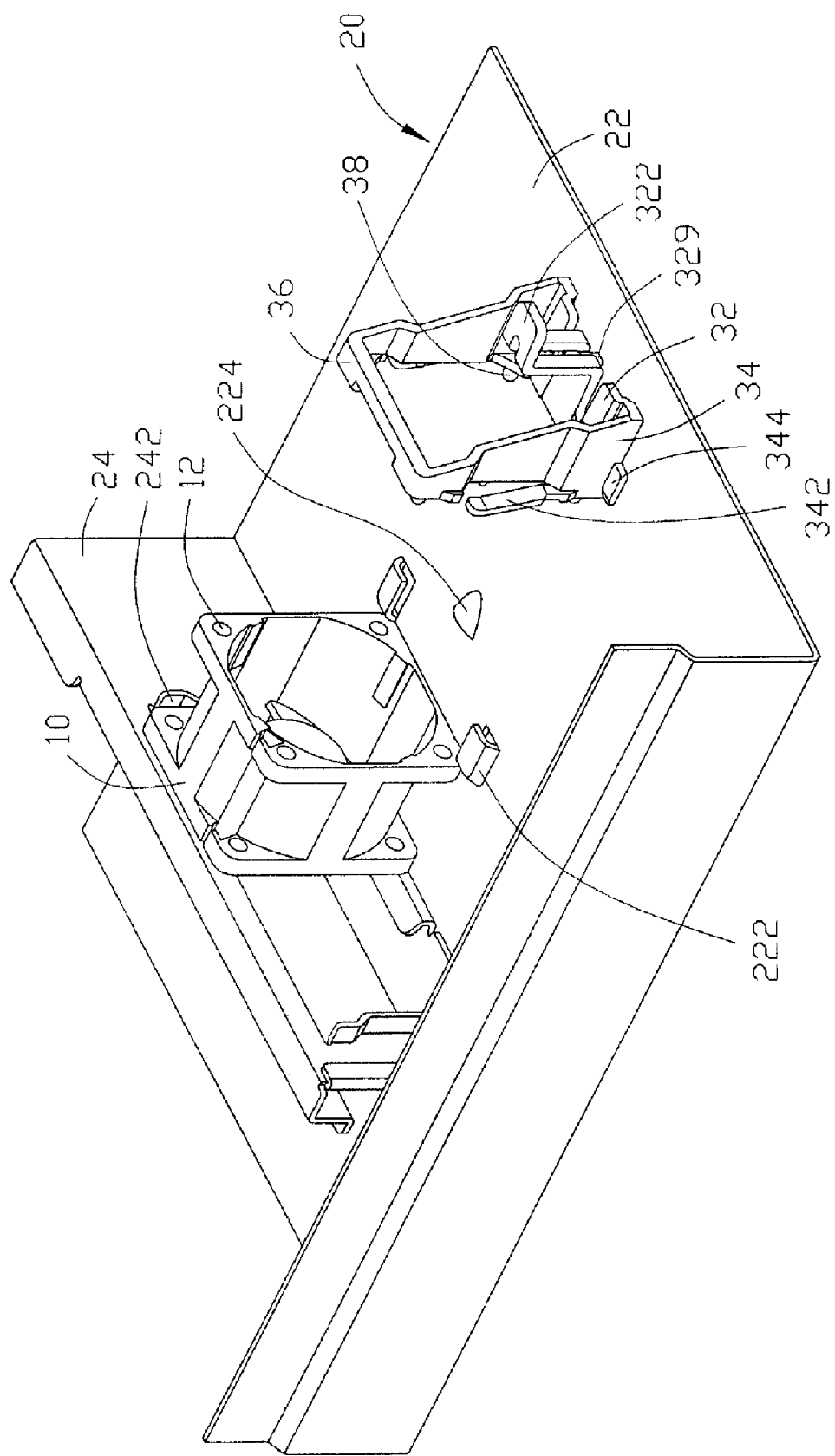
FIG. 3 is an assembled view of FIG. 1, showing the fan positioned in a locked position and the bracket positioned in an unlocked position.
Figure 4:
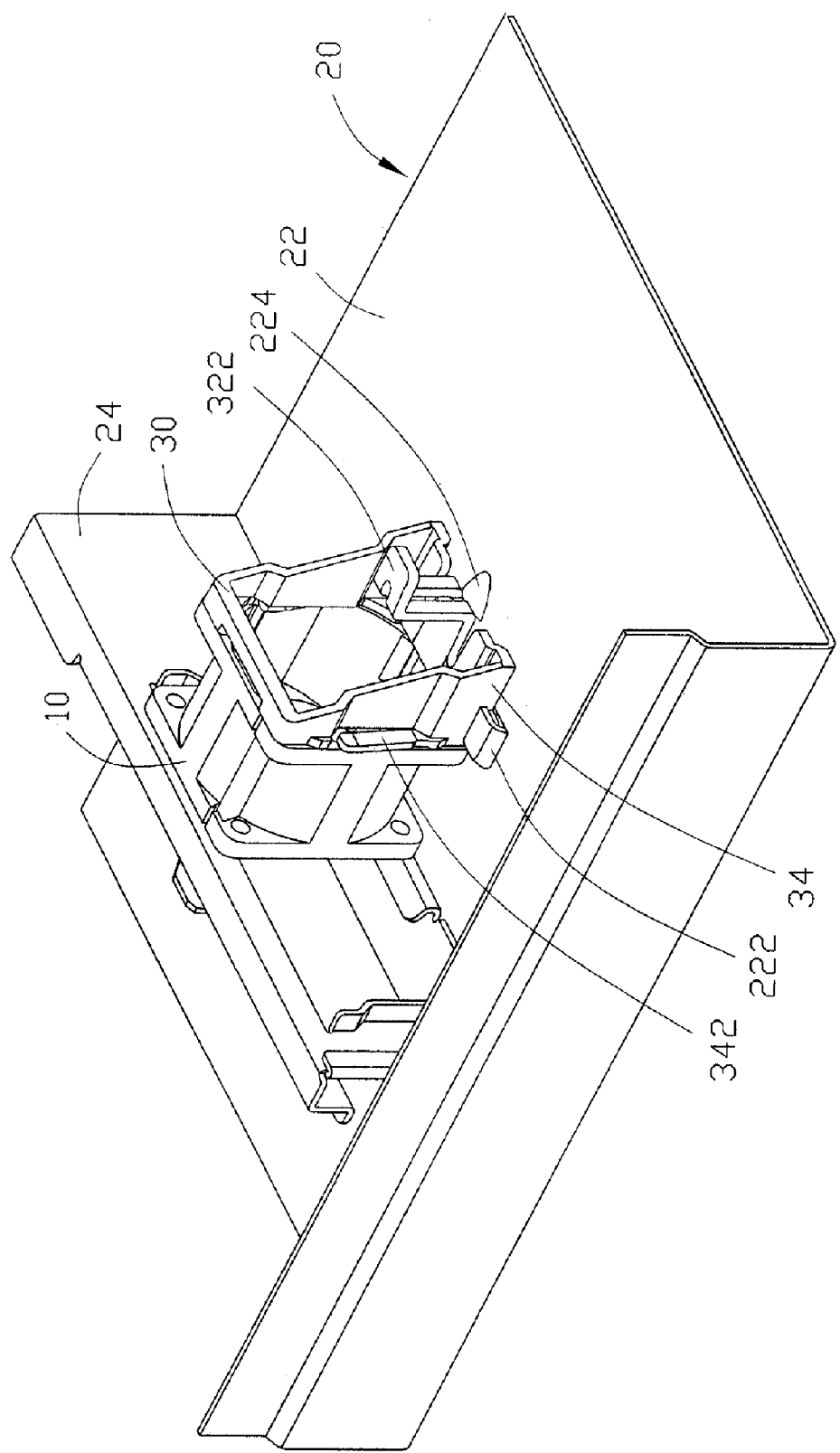
FIG. 4 is another assembled view of FIG. 1, showing the fan and the bracket positioned in the locked position.

Referring also to FIGS. 3 and 4, in assembly, the fan 10 is placed on the bottom plate 22 of the chassis 20 between the side plate 24 and the positioning pieces 222, and abuts on the flange 242. The bracket 30 is placed on the bottom plate 22. The resilient fingers 342 are adjacent the fan 10. The protrusion 224 is positioned into the recess 323 of the bottom wall 32 of the bracket 30. The positioning tabs 344 and the posts 38 of the bracket 30 respectively align with the positioning pieces 222 of the bottom plate 22 and the through holes 12 of the fan 10. The bracket 30 is pushed to slide on the bottom plate 22 towards the side plate 24. When the protrusion 224 of the bottom plate 22 slides along the slanted surface 3292 of the block 329 of the bracket 30, the protrusion 224 pushes the block 329 to deform the base portion 324 of the handle 322 upwardly. After the block 329 passes across the protrusion 224, the base portion 324 of the handle 322 rebounds. The stop surface 3294 of the block 329 abuts against the protrusion 224, thereby blocking the bracket 30 moving away from the side plate 24. The posts 38 are inserted into the corresponding through holes 12 of the fan 10. The positioning tabs 344 are inserted into the gaps between the corresponding positioning pieces 222 and the bottom plate 22. The fingers 342 are sandwiched between the fan 10 and the bracket 30, thereby pressing the fan to tightly abut on the side plate 24.

The bracket 30 is secured on the bottom plate 22, and the fan 10 is thus secured between the side plate 24 and the bracket 30.

In removal of the fan 10, the handle 322 is pulled up to deform the base portion 324. The stop surface 3294 of the block 329 is disengaged from the protrusion 224 of the bottom plate 22. The bracket 30 is then pulled out away from the side plate 24. When the positioning tabs 344 of the bracket 30 slide out of the gaps between the positioning pieces 222 and the bottom plate 22, the posts 38 slide out of the through holes 12 of the fan 10. The bracket 30 is removed from the bottom plate 22. The fan 10 can be thus removed from the chassis 20.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting apparatus for a fan with a plurality of through holes defined, comprising:
   a chassis comprising a bottom plate and a side plate perpendicular to the bottom plate for the fan abutting thereon, a pair of positioning pieces and a protrusion being formed on the bottom plate; and
   a bracket removably secured to the bottom plate for preventing the fan moving away from the side plate, a plurality of posts protruding from the bracket for inserting into the through holes of the fan to prevent the fan moving along the side plate, a pair of positioning tabs extending from the bracket for engaging with the positioning pieces of the bottom plate and a handle with a block formed thereon, the block engaging with the protrusion of the bottom plate, while the positioning tabs slide along the bottom plate toward the side plate to a position underneath the positioning pieces, and the block is capable of being disengaged from the protrusion by driving the handle away from the bottom plate; wherein the positioning piece abuts the fan to limit the fan moving away from the side plate in a direction perpendicular to the side plate.

2. The mounting apparatus as described in claim 1, wherein a flange is formed on the side plate for positioning the fan to have the posts of the bracket inserting into the through holes when the positioning tabs of the bracket engage with the positioning pieces of the bottom plate.

3. The mounting apparatus as described in claim 1, wherein the handle comprises a resilient base portion and a generally L-shaped operating portion extending from a free end of the base portion, the block being formed on the base portion.

4. The mounting apparatus as described in claim 3, wherein a recess is defined in the bracket for allowing the protrusion of the bottom plate to engage with the block of the bracket.

5. The mounting apparatus as described in claim 3, wherein a pair of cutouts is defined in the bracket at both sides of the base portion for allowing the base portion easily deforming when driving the operating portion of the handle.

6. The mounting apparatus as described in claim 1, wherein at least one resilient finger extends from the bracket for pressing the fan tightly abutting on the side plate.

7. An assembly comprising:
   a chassis comprising a bottom plate, and a side plate perpendicular to the bottom plate;
   a bracket detachably secured to the bottom plate, at least one post extending from the bracket;
   a fan sandwiched between the side plate and the bracket, at least one through hole being defined in the fan for receiving the at least one post of the bracket to position the fan on the bottom plate; and
   a positioning structure and a blocking structure being formed on the bracket and the bottom plate, the positioning structure preventing the bracket moving in a direction perpendicular to the bottom plate, and abutting the fan to prevent the fan moving away from the side plate; and the blocking structure preventing the bracket detaching from the bottom plate in a direction perpendicular to the side plate, while the positioning tabs slide along the bottom plate toward the side plate to a position underneath the positioning structure.

8. The assembly as described in claim 7, wherein the positioning structure comprises a pair of positioning pieces formed on the bottom plate and a pair of positioning tabs formed on the bracket for engaging with the positioning pieces.

9. The assembly as described in claim 7, wherein the blocking structure comprises a protrusion formed on the bottom plate and a block formed on the bracket for engaging with the protrusion.

10. The assembly as described in claim 9, wherein the bracket comprises a resilient handle, the block being formed on the handle and capable of being disengaged from the protrusion of the bottom plate by driving the handle.

11. The assembly as described in claim 10, wherein the handle comprises a resilient base portion and a generally L-shaped operating portion, the block being formed on the base portion.

12. The assembly as described in claim 11, wherein a pair of cutouts is defined in the bracket in both sides of the base portion to allow the base portion to be deformable.

13. The assembly as described in claim 7, wherein at least one resilient finger extends from the bracket, and is sandwiched between the fan and the bracket for pressing the fan on the side plate.

14. An assembly comprising:
   a chassis comprising a bottom plate, and a side plate perpendicular to the bottom plate, a pair of positioning members and a blocking member being formed on the bottom plate;
   a bracket being slidably attached to the bottom plate in a front-to-back direction, the positioning members providing a rail for the bracket to slide along the rail and positioning the bracket to the bottom plate in left-to-right and up-to-down directions, and the positioning members abutting the fan to prevent the fan moving away from the side plate; the blocking member configured for blocking the bracket withdrawing from the bottom plate in the front-to-back direction after the bracket sliding over it;
   a fan sandwiched between the side plate and the bracket; and
   post and hole combination formed between the fan and the bracket for positioning the fan in left-to-right and up-to-down directions.

15. The assembly as claimed in claim 14, wherein the blocking member is farther from the side plate than the positioning members.

16. The assembly as claimed in claim 14, wherein the bracket comprises a resilient handle with a block formed thereon for engaging with the blocking member of the chassis, the block being disengagable from the blocking member by driving the handle.

17. The assembly as claimed in claim 16, wherein the handle comprises a resilient base portion with a pair of cutouts defined at opposite peripheral sides thereof, and a substantially L-shaped operating portion extending from the base portion, the block being formed on the base portion.

18. The assembly as claimed in claim 16, wherein the blocking member of the chassis comprises a protrusion protruding upward from the bottom plate of the chassis, and the block of the bracket comprises a slanted surface for allowing the block to easily slide across the protrusion, and a stop surface for engaging with the protrusion to block the bracket from sliding reversely.

19. The assembly as claimed in claim 14, wherein at least one slanted resilient finger extends from the bracket configured for pressing the fan toward the side plate.

\* \* \* \* \*